(12) United States Patent
Liu et al.

(10) Patent No.: US 11,746,003 B2
(45) Date of Patent: Sep. 5, 2023

(54) CHIP PACKAGE

(71) Applicant: XINTEC INC., Taoyuan (TW)

(72) Inventors: Tsang-Yu Liu, Zhubei (TW);
Chaung-Lin Lai, Taoyuan (TW);
Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/711,067

(22) Filed: Apr. 1, 2022

(65) Prior Publication Data

US 2022/0219970 A1 Jul. 14, 2022

Related U.S. Application Data

(62) Division of application No. 16/941,465, filed on Jul. 28, 2020, now Pat. No. 11,319,208.

(60) Provisional application No. 62/879,964, filed on Jul. 29, 2019.

(51) Int. Cl.
*B81B 7/00* (2006.01)
*B81C 1/00* (2006.01)

(52) U.S. Cl.
CPC ............ *B81B 7/007* (2013.01); *B81B 7/0074* (2013.01); *B81C 1/00301* (2013.01); *B81B 2207/07* (2013.01)

(58) Field of Classification Search
CPC ... B81B 7/007; B81B 7/0074; B81B 2207/07; B81C 1/00301; H01L 21/50; H01L 21/56; H01L 23/3157; H01L 25/16; H01L 25/50; H10B 80/00
See application file for complete search history.

(56) References Cited

U.S. PATENT DOCUMENTS

| | | | |
|---|---|---|---|
| 2005/0146005 A1* | 7/2005 | Shimoishizaka ... | H01L 25/0657 257/E29.022 |
| 2009/0309206 A1 | 12/2009 | Kim et al. | |
| 2017/0170154 A1 | 6/2017 | Ryu et al. | |
| 2018/0076179 A1* | 3/2018 | Hsu ......................... | H01L 24/14 |
| 2019/0140012 A1 | 5/2019 | Kuan et al. | |

* cited by examiner

*Primary Examiner* — Timor Karimy
(74) *Attorney, Agent, or Firm* — LIU & LIU

(57) ABSTRACT

A chip package includes a first die, a second die, a molding material, and a redistribution layer. The first die includes a first conductive pad. The second die is disposed on the first die and includes a second conductive pad. The molding material covers the first die and the second die. The molding material includes a top portion, a bottom portion, and an inclined portion adjoins the top portion and the bottom portion. The top portion is located on the second die, and the bottom portion is located on the first die. The redistribution layer is disposed along the top portion, the inclined portion, and the bottom portion. The redistribution layer is electrically connected to the first conductive pad and the second conductive pad.

12 Claims, 8 Drawing Sheets

CHIP PACKAGE

CROSS-REFERENCE TO RELATED APPLICATION

The present application is a Divisional Application of the U.S. application Ser. No. 16/941,465, filed Jul. 28, 2020, which claims priority to U.S. Provisional Application Ser. No. 62/879,964, filed Jul. 29, 2019, which are herein incorporated by reference in their entireties.

BACKGROUND

Field of Invention

The present invention relates to a chip package and a manufacturing method of the chip package.

Description of Related Art

A typical chip package includes plural dies arranged adjacently, and those dies are electrically connected to the same side of a printed circuit board (PCB) through wire-bonding. The other side of the PCB is connected to external devices through conductive structures (e.g., solder bumps). However, when plural dies are integrated to the same chip package, area of the chip package will be dramatically increased, which is against minimization design. In addition, reliability of wire-bonding method is lower, and the wire-bonding method may occupy more volume of the chip package such as the height of a top of the wire.

SUMMARY

The invention provides a chip package.

In one embodiment of the present invention, the chip package includes a first die, a second die, a molding material, and a redistribution layer. The first die includes a first conductive pad. The second die is disposed on the first die and includes a second conductive pad. The molding material covers the first die and the second die. The molding material includes a top portion, a bottom portion, and an inclined portion adjoins the top portion and the bottom portion. The top portion is located on the second die, and the bottom portion is located on the first die. The redistribution layer is disposed along the top portion, the inclined portion, and the bottom portion. The redistribution layer is electrically connected to the first conductive pad and the second conductive pad.

In one embodiment of the present invention, the bottom portion and the top portion of the molding material respectively have a first through hole and a second through hole, and the first conductive pad and the second conductive pad are respectively located in the first through hole and the second through hole.

In one embodiment of the present invention, a top surface of the bottom portion is lower than a top surface of the top portion.

In one embodiment of the present invention, the inclined portion and the bottom portion of the molding material form an obtuse angle.

In one embodiment of the present invention, the chip package further comprises an adhesive layer disposed between the first die and the second die.

In one embodiment of the present invention, the chip package further comprises a passivation layer covering the redistribution layer and the molding material.

In one embodiment of the present invention, the passivation layer and the molding material include different materials.

In one embodiment of the present invention, the passivation layer has an opening, the chip package further includes a conductive structure, and the conductive structure is located on the redistribution layer in the opening.

Another aspect of the present invention is a chip package.

In one embodiment of the present invention, the chip package includes a first die, a second die, a molding material, and a redistribution layer. The first die includes a first conductive pad. The second die is disposed on the first die and includes a second conductive pad. The molding material covers the first die and the second die. The molding material includes a top portion, a bottom portion, and an inclined portion adjoins the top portion and the bottom portion. The top portion is located on the second die, and the bottom portion is located on the first die. A distance between a top surface of the top portion and a top surface of the bottom portion is smaller than a distance between the top surface of the top portion and the first die. The redistribution layer is disposed along the top portion, the inclined portion, and the bottom portion. The redistribution layer is electrically connected to the first conductive pad and the second conductive pad.

In one embodiment of the present invention, the bottom portion and the top portion of the molding material respectively have a first through hole and a second through hole, and the first conductive pad and the second conductive pad are respectively located in the first through hole and the second through hole.

In one embodiment of the present invention, a top surface of the bottom portion is lower than a top surface of the top portion.

In one embodiment of the present invention, the inclined portion and the bottom portion of the molding material form an obtuse angle.

In one embodiment of the present invention, the chip package further comprises an adhesive layer disposed between the first die and the second die.

In one embodiment of the present invention, the chip package further comprises a passivation layer covering the redistribution layer and the molding material.

In one embodiment of the present invention, the passivation layer and the molding material include different materials.

In one embodiment of the present invention, the passivation layer has an opening, the chip package further includes a conductive structure, and the conductive structure is located on the redistribution layer in the opening.

In the aforementioned embodiments, since the first die and the second die of the chip package are stacked along the longitudinal direction, the area of the chip package can be reduced and the chip package may be multi-functional package. In addition, since the molding material includes the inclined portion and the bottom portion and the top portion that are respectively located on the first die and the second die, the aspect ratio of the through hole of the molding material can be sufficiently reduced. Therefore, the redistribution layer is prevented from breaking such that the reliability is sufficiently enhanced.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
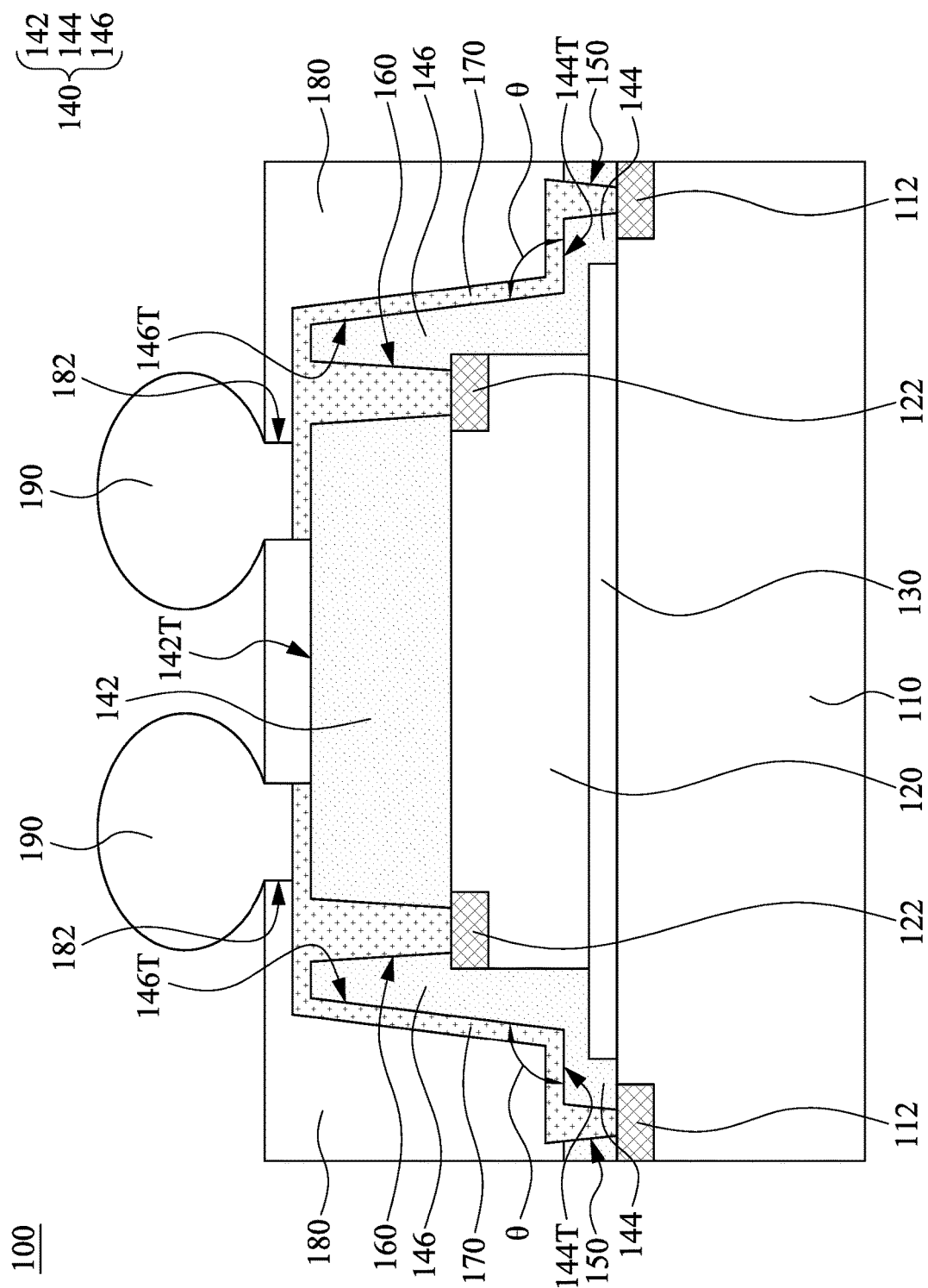
FIG. 1 is a cross-sectional view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip package 100 according to one embodiment of the present invention. The chip package 100 includes a first die 110, a second die 120, a molding material 140, and a redistribution layer 170. The first die 110 includes a first conductive pad 112, and the second die 120 includes a second conductive pad 122. The molding material 140 covers the first die 110 and the second die 120. The molding material 140 includes a top portion 142, a bottom portion 144, and an inclined portion 146 adjoins the top portion 142 and the bottom portion 144. The top portion 142 is located on the second die 120, and the bottom portion 144 is located on the first die 110. In the present embodiment, the molding material 140 may be a molding compound. The redistribution layer 170 is disposed along the top portion 142, the inclined portion 146, and the bottom portion 144. The redistribution layer 170 is electrically connected to the first conductive pad 112 and the second conductive pad 122.

In addition, the chip package 100 further includes an adhesive layer 130 disposed between the first die 110 and the second die 120 so as to bond the first die 110 and the second die 120. The chip package 100 of the present invention may be a system in package (SIP). The first die 110 and the second die 120 may have different function, such that the chip package 100 may be multi-functional package. For example, the first die 110 may be an active device, such as an application specific integrated circuit (ASIC). The second die 120 may be passive element, such as the micro-electro-mechanical systems (MEMS). In some embodiments, the first die 110 is a computing unit, and the second die 120 is an accelerator. In the present embodiment, since the first die 110 and the second die 120 are stacked along the longitudinal direction, the area of the chip package 100 can be reduced.

As shown in FIG. 1, the width of the second die 120 is smaller than the width of the first die 110. The first conductive pad 112 is not overlapped with the second conductive pad 122. In other words, a portion of the first die 110 is not covered by the second die 120 and the adhesive layer 130. The first die 110 is closer to an outer side of the chip package 100 than the second die 120. The bottom portion 144 of the molding material 140 is located at a portion of the first die 110 that is not covered by the second die 120. That is, the bottom portion 144 of the molding material 140 covers the first conductive pad 112 of the first die 110.

The bottom portion 144 of the molding material 140 has a top surface 144T, the top portion 142 of the molding material 140 has a top surface 142T, and the top surface 144T of the bottom portion 144 is lower than the top surface 142T of the top portion 142. The inclined portion 146 and the bottom portion 144 of the molding material 140 form an obtuse angle θ. The obtuse angle θ is beneficial to forming the redistribution layer 170 on the molding material 140 so as to prevent the redistribution layer 170 from breaking. In other words, the inclined portion 146 has a top surface 146T connecting to the top surface 142T of the top portion 142 and the top surface 144T of the bottom portion 144. As shown in FIG. 1, the top surface 142T of the top portion 142, the top surface 144T of the bottom portion 144, and the top surface 146T of the inclined portion 146 collectively form a stepped surface.

The bottom portion 144 and the top portion 142 of the molding material 140 respectively have a first through hole 150 and a second through hole 160. The first conductive pad 112 and the second conductive pad 122 are respectively located in the first through hole 150 and the second through hole 160. Since the top surface 144T of the bottom portion 144 is lower than the top surface 142T of the top portion 142, the aspect ratio of the first through hole 150 can be sufficiently reduced. The depth of the first through hole 150 is substantially the same as the thickness of the bottom portion 144. In other words, the depth of the first through hole 150 is determined by the thickness of the bottom portion 144, and the depth of the first through hole 150 is not limited by the thickness of the second die 120. Therefore, chosen of the second die 120 can be more flexible. In addition, since the second die 120 is stacked on the first die 110, the depth of the second through hole 160 is determined by the thickness of the top portion 142 of the molding material 140. Therefore, the aspect ratio of the second through hole 160 can be reduced.

The redistribution layer 170 is conformal to the top portion 142, the inclined portion 146, and the bottom portion 144, and the redistribution layer 170 extend to the first through hole 150 and the second through hole 160. In the present embodiment, since the aspect ratios of the first through hole 150 and the second through hole 160 are lower, and the redistribution layer 170 is disposed along the stepped surface of the molding material 140 (that is the surface collectively formed by the top portion 142, the inclined portion 146, and the bottom portion 144), the redistribution layer 170 is prevented from breaking such that the reliability is sufficiently enhanced. In addition, cleaning of the first through hole 150 and the second through hole 160 is easier. As such, a pitch between the first conductive pad 112 and the second conductive pad 122 can be reduced, such that the competitiveness of the chip package 100 is enhanced.

The chip package further includes a passivation layer 180 and a conductive structure 190. The passivation layer 180 covers the redistribution layer 170 and the molding material 140. The passivation layer 180 has an opening 182. The conductive structure 190 is located on the redistribution layer 170 in the opening 182. In some embodiments, the conductive structure 190 may be a ball grid array (BGA), a conductive bump, or a conductive pillar.

In the present embodiment, since the first die 110 and the second die 120 of the chip package 100 are electrically connected to the conductive structure 190 through the redistribution layer 170, it is more stable than a typical wire-bonding packaging method. Therefore, the volume of the chip package 100 can be sufficiently reduced. In addition, the distance for a signal transmitted to the conductive structure 190 through the redistribution layer 170 is reduced, such that the performance of the chip package 100 is enhanced.

It is to be noted that the connection relationships, materials, and advantages of the elements described above will not be repeated. In the following description, a manufacturing method of the chip package 100 will be described.

Figure 2:
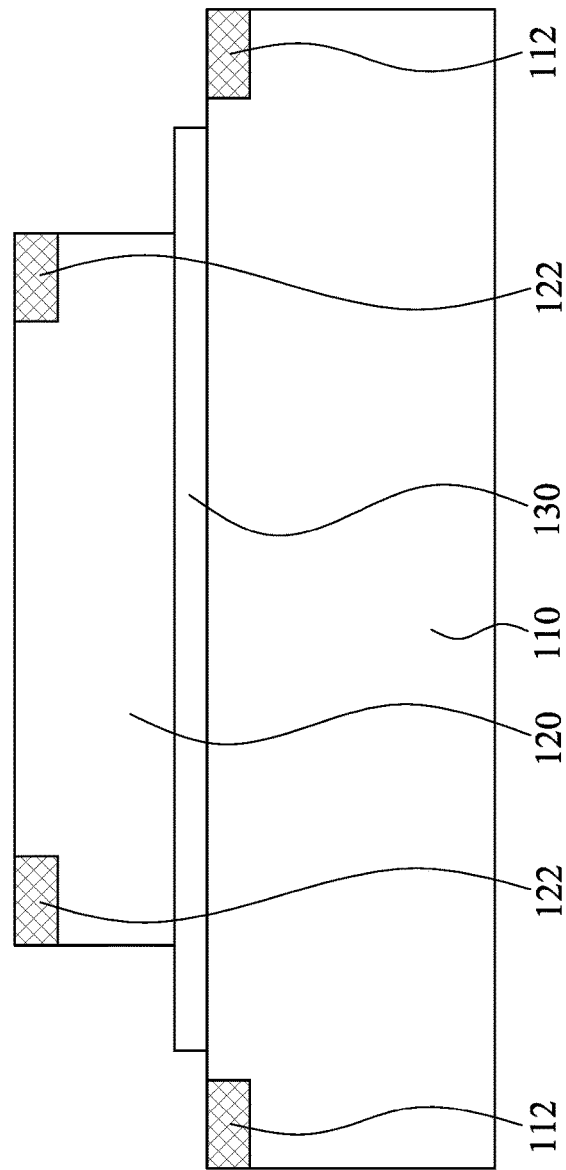
FIGS. 2-6 are cross-sectional views of different stages of a manufacturing method of the chip package in FIG. 1.

FIGS. 2-6 are cross-sectional views of different stages of a manufacturing method of the chip package 100 in FIG. 1. Reference is made to FIG. 2, the first die 110 and the second die 120 are bonded through the adhesive layer 130 first. The first conductive pad 112 of the first die 110 is not covered by the second die 120 and the adhesive layer 130. Therefore, the first conductive pad 112 of the first die 110 is exposed from the second die 120 and the adhesive layer 130.

Figure 3:
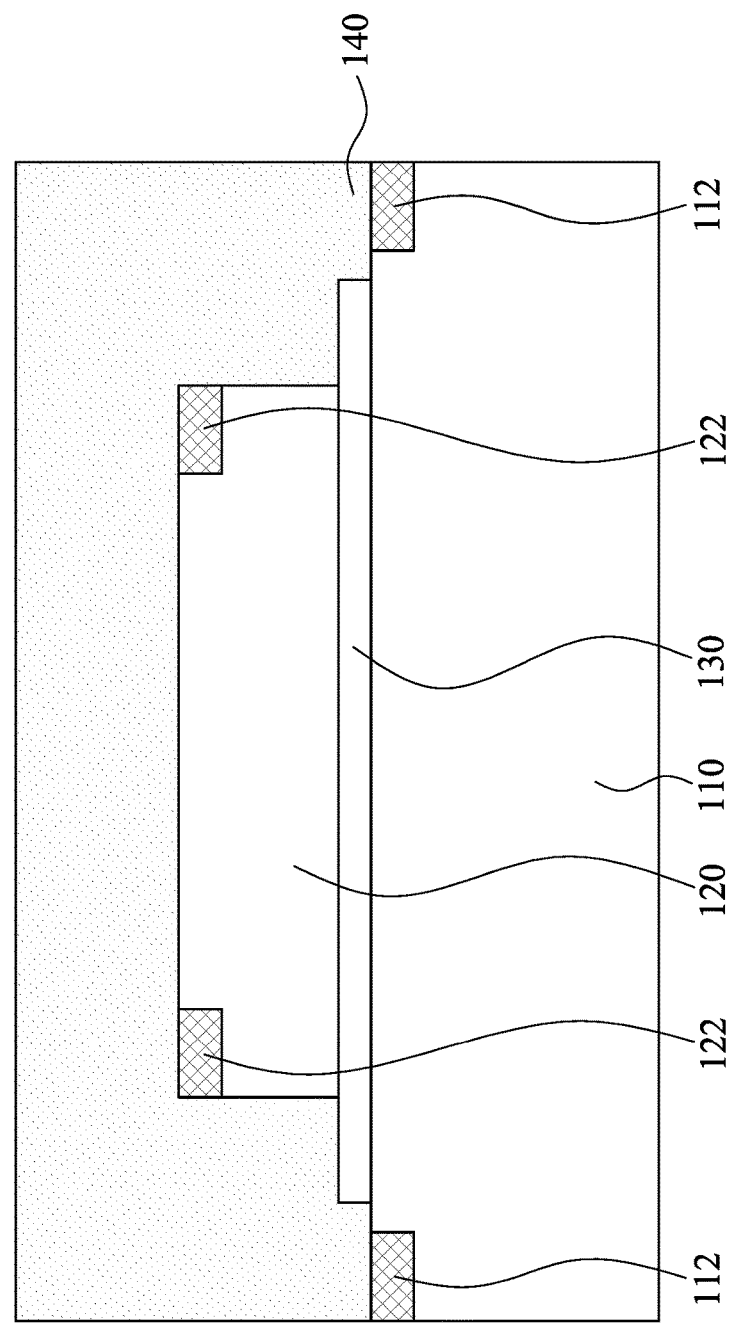

Reference is made to FIG. 3, a molding material 140 is formed so as to cover the first die 110 and the second die 120. Specifically, the molding material 140 surrounds the second die 120 and is in contact with a sidewall of the second die 120, and the molding material 140 covers the first conductive pad 112 and the second conductive pad 122.

Figure 4:
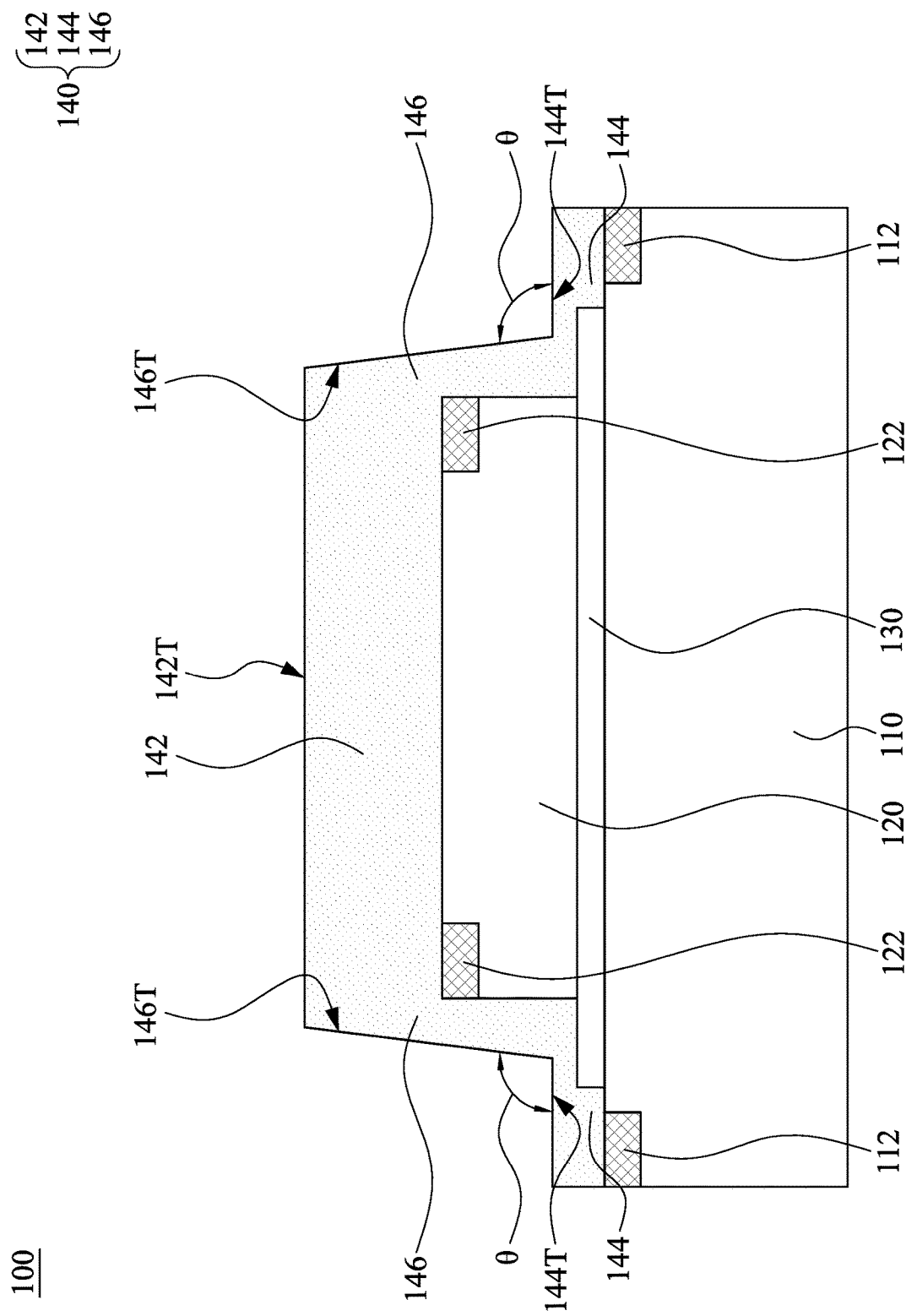

Reference is made to FIG. 4, a portion of the molding material 140 surrounding the second die 120 is removed such that the molding material 140 has a top portion 142, a bottom portion 144, and an inclined portion 146 adjoins the top portion 142 and the bottom portion 144. In addition, the top surface 144T of the bottom portion 144 is lower than the top surface 142T of the top portion 142. Removing the portion of the molding material 140 surrounding the second die 120 is performed through cutting by a blade. For example, the blade may have a specific width, and two opposite sides of the blade each has an inclined surface similar to the top surface 146T of the inclined portion 146. As such, a smooth top surface 146T of the inclined portion 146 and a smooth top surface 144T of the bottom portion 144 may be quickly formed through the blade. And the obtuse angle between the inclined portion 146 and the bottom portion 144 may be formed. In some embodiments, the width of the blade is in a range from about 1 um to 3 um.

Figure 5:
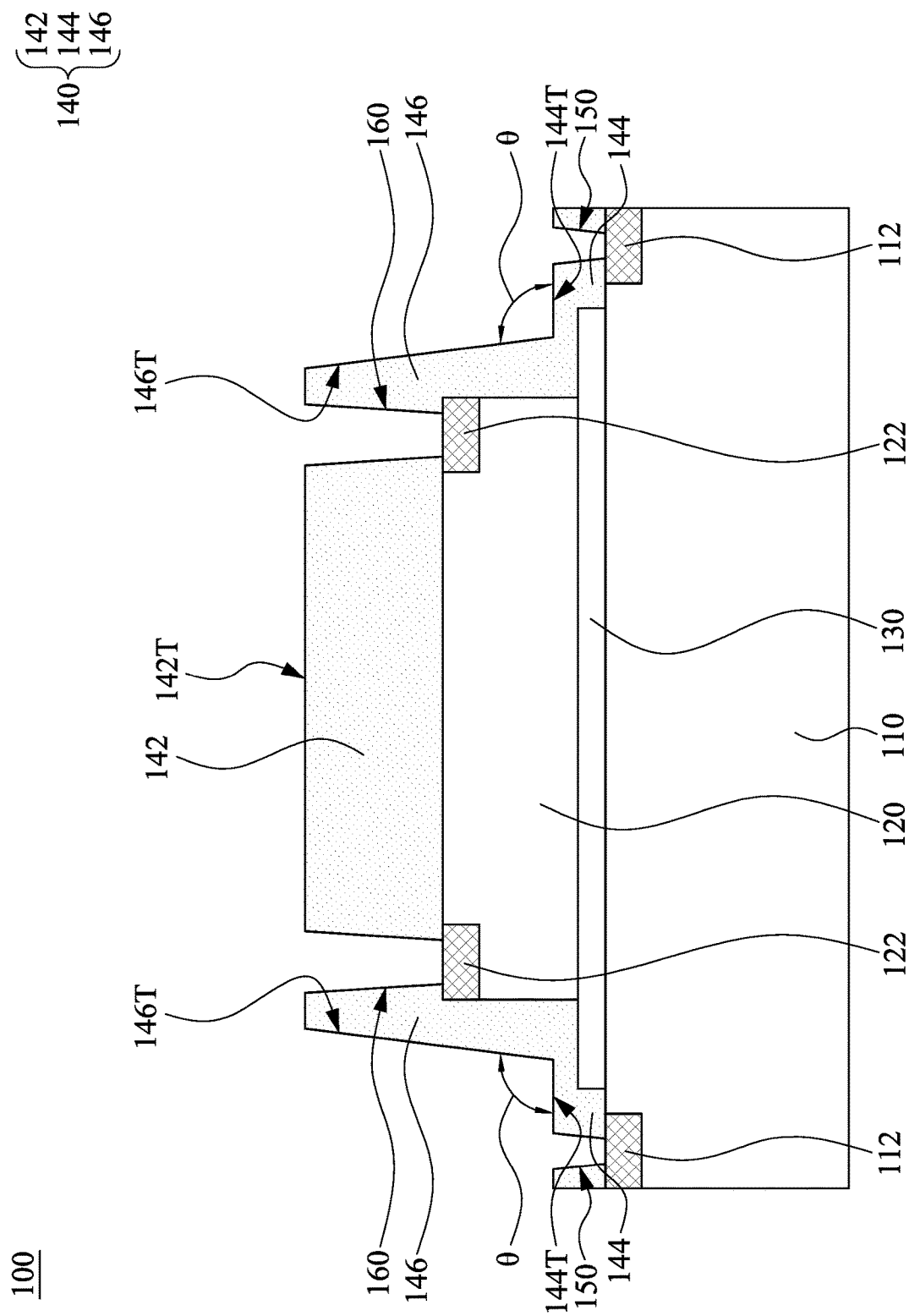

Reference is made to FIG. 5, a first through hole 150 and a second through hole 160 are respectively formed in the bottom portion 144 and the top portion 142 of the molding material 140 such that the first second conductive pad 112 and the second conductive pad 122 are respectively exposed from the first through hole 150 and the second through hole 160. Formation of the first through hole 150 and the second through hole 160 is performed by laser drilling. As such, the first second conductive pad 112 and the second conductive pad 122 may be exposed from the first through hole 150 and the second through hole 160 precisely.

Figure 6:
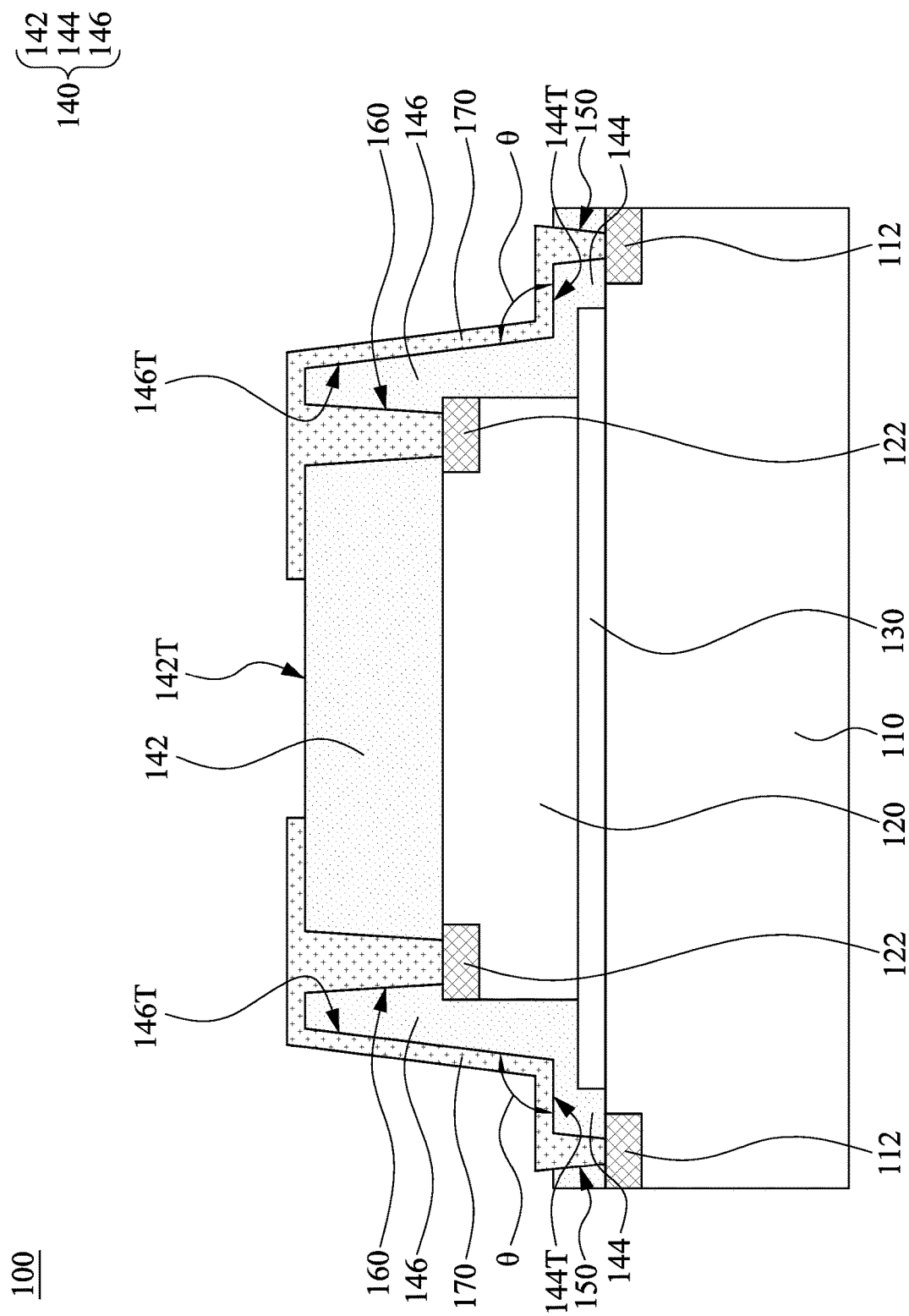

Reference is made to FIG. 6, a redistribution layer 170 is formed and is disposed along the top portion 142, the inclined portion 146, and the bottom portion 144. The redistribution layer 170 extends to the first conductive pad 112 in the first through hole 150 and the second conductive pad 122 in the second through hole 160. In the present embodiment, since the top surface 146T of the inclined portion 146 is a smooth and inclined surface, it is beneficial for the redistribution layer 170 to be attached on the inclined portion 146. Therefore, the redistribution layer 170 can be prevented from breaking. In addition, since the aspect ratios of the first through hole 150 and the second through hole 160 are smaller, the redistribution layer 170 that extends to the first through hole 150 and the second through hole 160 may be prevented from breaking due to gap formed therein.

Reference is made again to FIG. 1, after the redistribution layer 170 is formed, a passivation layer 180 is formed to cover the redistribution layer 170 and the molding material 140. Subsequently, the opening 182 is formed in the passivation layer 180, such that the redistribution layer 170 is exposed from the opening 182. Subsequently, the conductive structure 190 is formed on the redistribution layer 170 in the opening 182, such that the conductive structure 190 is electrically connected to the redistribution layer 170.

In the following description, other types of the second die and the chip package will be described.

Figure 7:
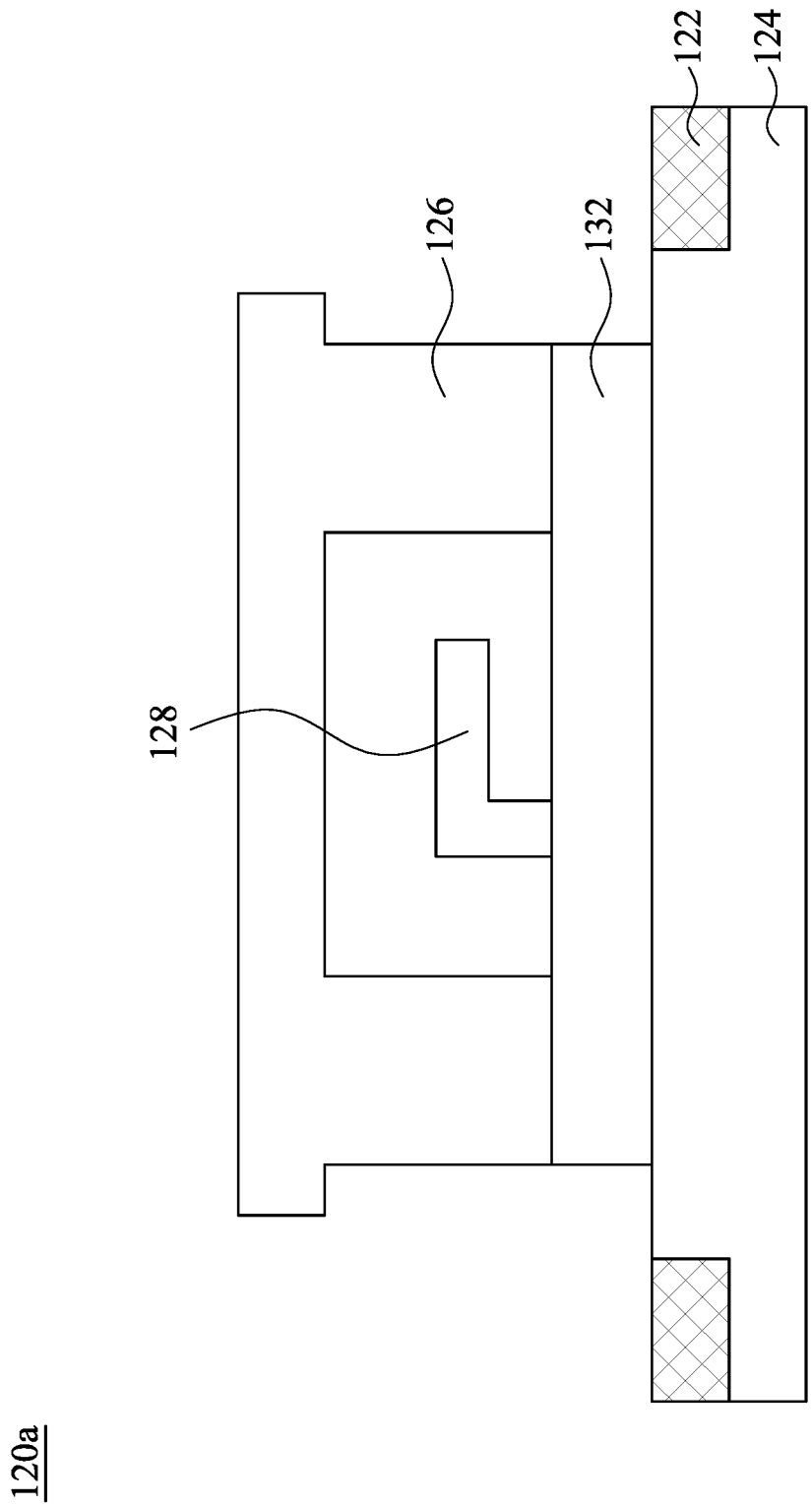
FIG. 7 is a cross-sectional view of a second chip according to one embodiment of the present invention.

FIG. 7 is a cross-sectional view of a second chip 120a according to one embodiment of the present invention. The second chip 120a includes a main portion 124, a cap portion 126, and a sensor 128. The main portion 124 has the second conductive pad 122. The second die 120a further includes an adhesive layer 132 disposed to bond the cap portion 126 and the sensor 128 on the main portion 124. In some embodiments, the main portion 124 can be the micro-electro-mechanical systems (MEMS). The sensor 128 may be the cantilever. In some embodiments, the second conductive pad 122 of the second die 120a may be disposed on the cap portion 126.

Figure 8:
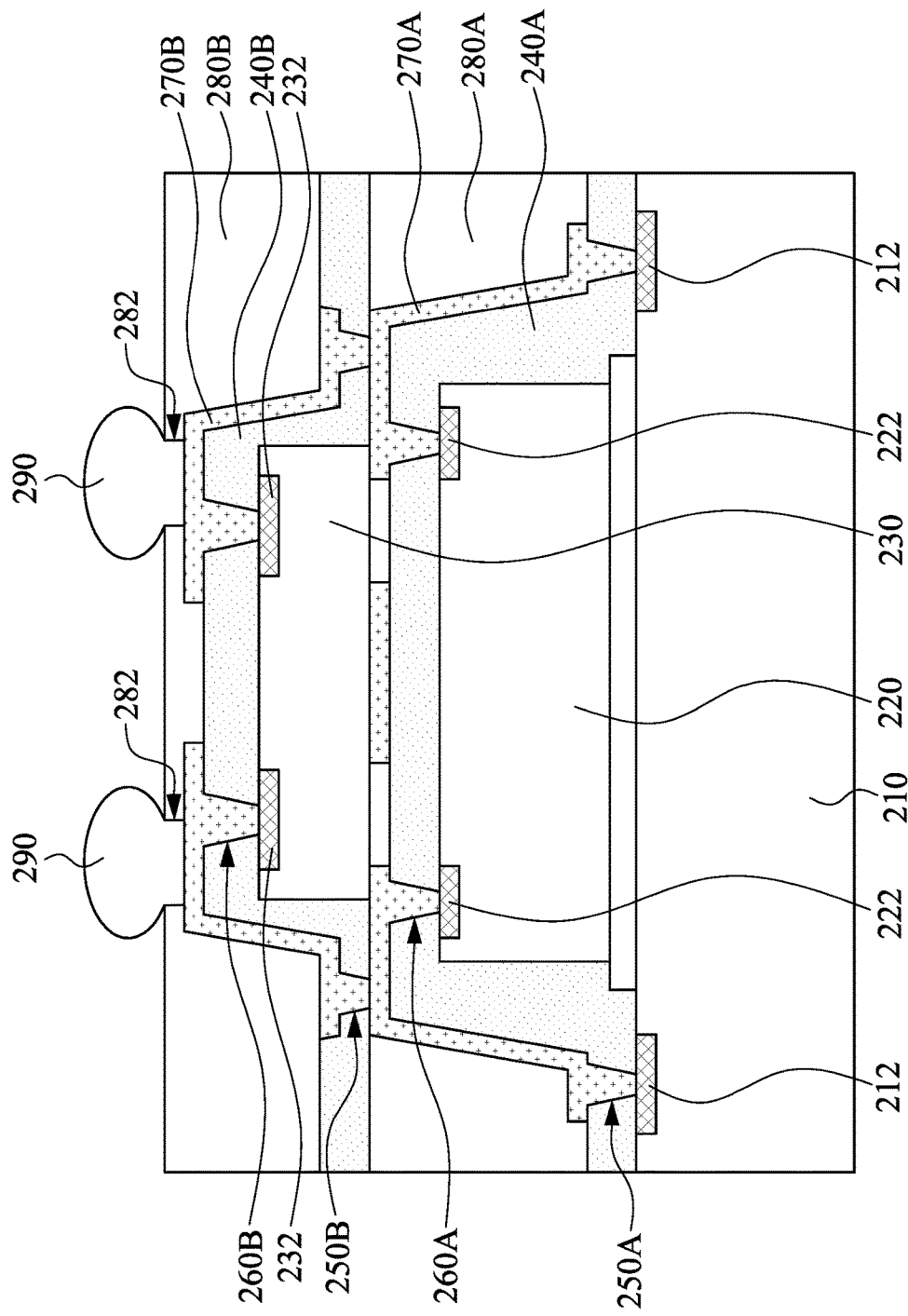
FIG. 8 is a cross-sectional view of a chip package according to one embodiment of the present invention.

FIG. 8 is a cross-sectional view of a chip package 200 according to one embodiment of the present invention. The chip package 200 includes a first die 210, a second die 220, a molding material 240 A, a redistribution layer 270A, and a passivation layer 280A. The first die 210 and the second die 220 respectively have a first conductive pad 212 and a second conductive pad 222. The above structures are similar to the aforementioned structure and manufacturing method of the chip package 100, and the description will not be repeated hereinafter.

The difference from the chip package 100 shown in FIG. 1 is that the chip package 200 further includes a third die 230, a molding material 240B, a redistribution layer 270B and a passivation layer 280B. The third die 230 is located on the redistribution layer 270A and the passivation layer 280B, and the third die 230 has a third conductive pad 232. The molding material 240B covers the third die 230, the redistribution layer 270A and the passivation layer 280A. The molding material 240B has a third through hole 250B and a fourth through hole 260B, and the third conductive pad 232 is located in the fourth through hole 260B. The redistribution layer 270B is electrically connected to the third conductive pad 232 and the second conductive pas 222. Specifically, the second through hole 260A is electrically connected to the third through hole 250B, and the redistribution layer 270B is electrically connected to the second conductive pas 222 through the second through hole 260A and the third through hole 250B. The third through hole 250B and the fourth through hole 260B have similar structures to the structures of the first through hole 250A and the second through hole 260A. The molding material 240B, the redistribution layer 270B, and the passivation layer 280B respectively have similar structures to the structures of the molding material 240A, the redistribution layer 270A, and the passivation layer 280A. In other words, the method of stacking the third die 230 on the second die 220 is the same as the method of stacking the second die 220 on the first die 210. The chip package 220 further includes the opening 282 and the conductive structure 290. The opening 282 is located one the portion of the passivation layer 280B overlapped with the redistribution layer 270B. The conductive structure 290 is located one the redistribution layer 270B in the opening 282.

In the present embodiment, the first die 210, the second die 220, and the third die 230 may have different functions. The volume of the chip package 200 can be reduced by stacking the first die 210, the second die 220, and the third die 230 along the longitudinal direction, such that multiple functions can be integrated to the chip package 200. In addition, the molding material 240A and the molding material 240B both have the stepped surfaces similar to the stepped surface of the molding material 140 shown in FIG.

What is claimed is:

1. A chip package, comprising:
   a first die having a first conductive pad;
   a second die disposed on the first die and having a second conductive pad;
   a molding material covers the first die and the second die and having a top portion, a bottom portion, and an inclined portion adjoins the top portion and the bottom portion, wherein the top portion is located on the second die, and the bottom portion is located on the first die;
   a redistribution layer disposed along the top portion, the inclined portion, and the bottom portion, wherein the redistribution layer is electrically connected to the first conductive pad and the second conductive pad;
   a passivation layer covering the redistribution layer and the molding material, wherein the passivation layer has an opening above the redistribution layer; and
   a conductive structure located above the passivation layer and in the opening, wherein the redistribution layer is located between the conductive structure and the molding material.

2. The chip package of claim 1, wherein the bottom portion and the top portion of the molding material respectively have a first through hole and a second through hole, and the first conductive pad and the second conductive pad are respectively located below the first through hole and the second through hole.

3. The chip package of claim 1, wherein the inclined portion and the bottom portion of the molding material form an obtuse angle.

4. The chip package of claim 1, wherein a top surface of the bottom portion is lower than a top surface of the top portion.

5. The chip package of claim 1, further comprising an adhesive layer disposed between the first die and the second die.

6. The chip package of claim 1, wherein the passivation layer and the molding material comprise different materials.

7. A chip package, comprising:
   a first die having a first conductive pad;
   a second die disposed on the first die and having a second conductive pad;
   a molding material covers the first die and the second die and having a top portion, a bottom portion, and an inclined portion adjoins the top portion and the bottom portion, wherein the top portion is located on the second die, the bottom portion is located on the first die, and a distance between a top surface of the top portion and a top surface of the bottom portion is smaller than a distance between the top surface of the top portion and the first die;
   a redistribution layer disposed along the top portion, the inclined portion, and the bottom portion, wherein the redistribution layer is electrically connected to the first conductive pad and the second conductive pad;
   a passivation layer covering the redistribution layer and the molding material, wherein the passivation layer has an opening above the redistribution layer; and
   a conductive structure located above the passivation layer and in the opening, wherein the redistribution layer is located between the conductive structure and the molding material.

8. The chip package of claim 7, wherein the bottom portion and the top portion of the molding material respectively have a first through hole and a second through hole, and the first conductive pad and the second conductive pad are respectively located below the first through hole and the second through hole.

9. The chip package of claim 7, wherein the inclined portion and the bottom portion of the molding material form an obtuse angle.

10. The chip package of claim 7, wherein the top surface of the bottom portion is lower than the top surface of the top portion.

11. The chip package of claim 7, further comprising an adhesive layer disposed between the first die and the second die.

12. The chip package of claim 7, wherein the passivation layer and the molding material comprise different materials.

* * * * *